United States Patent
Pastorello et al.

(10) Patent No.: US 10,511,312 B1
(45) Date of Patent: Dec. 17, 2019

(54) METASTABLE-FREE OUTPUT SYNCHRONIZATION FOR MULTIPLE-CHIP SYSTEMS AND THE LIKE

(71) Applicant: Silicon Laboratories Inc., Austin, TX (US)

(72) Inventors: Douglas F. Pastorello, Hudson, NH (US); Timothy Monk, Hudson, NH (US); Ping Lu, Nashua, NH (US); Michael Lu, Westford, MA (US)

(73) Assignee: Silicon Laboratories Inc., Austin, TX (US)

( * ) Notice: Subject to any disclaimer, the term of this patent is extended or adjusted under 35 U.S.C. 154(b) by 0 days.

(21) Appl. No.: 16/456,195

(22) Filed: Jun. 28, 2019

(51) Int. Cl.
| | |
|---|---|
| *H03L 7/10* | (2006.01) |
| *H03L 7/081* | (2006.01) |
| *H03K 3/037* | (2006.01) |
| *H03K 5/00* | (2006.01) |
| *G06F 1/12* | (2006.01) |
| *G06F 1/10* | (2006.01) |
| *H03L 7/093* | (2006.01) |

(52) U.S. Cl.
CPC ............... *H03L 7/081* (2013.01); *G06F 1/10* (2013.01); *G06F 1/12* (2013.01); *H03K 3/037* (2013.01); *H03K 5/00* (2013.01); *H03K 2005/00019* (2013.01); *H03L 7/093* (2013.01)

(58) Field of Classification Search
USPC ...................................................... 327/158
See application file for complete search history.

(56) References Cited

U.S. PATENT DOCUMENTS

| | | | |
|---|---|---|---|
| 6,320,469 B1 * | 11/2001 | Friedberg ................ | H03L 7/095 327/156 |
| 6,781,429 B1 | 8/2004 | Smith | |
| 6,924,682 B1 | 8/2005 | Smith | |
| 6,999,546 B2 * | 2/2006 | Landaiche .............. | H03L 7/081 327/144 |

(Continued)

OTHER PUBLICATIONS

JEDEC Standard; "Serial Interface for Data Converters"; white paper; JESD204B; Jul. 2011; JEDEC Solid State Technology Association; 3103 North 10th Street, Suite 240 South; Arlington, VA; 22201; United States; 147 pages.

(Continued)

*Primary Examiner* — Adam D Houston
(74) *Attorney, Agent, or Firm* — Polansky & Associates, P.L.L.C.; Paul J. Polansky

(57) ABSTRACT

A chip having output synchronization includes a phase detector for receiving an external reference clock signal, an input delay path coupled to an output of the phase detector and having an output for providing an internal reference clock signal, an output delay path coupled to the output of the input delay path and having an output coupled to a feedback input of the phase detector, a phase adjustment circuit having a first input coupled to the output of the input delay path, a second input for receiving a local clock signal, and an output coupled to the control input of the input delay path, and a synchronization capture circuit having a first input coupled to the output of said input delay path, a second input for receiving the local clock signal, a third input for receiving a synchronization signal, and an output for providing a synchronization trigger signal.

26 Claims, 8 Drawing Sheets

(56) References Cited

U.S. PATENT DOCUMENTS

| | | | | |
|---|---|---|---|---|
| 7,236,040 B2* | 6/2007 | Chan | .......................... | G06F 1/04 |
| | | | | 327/156 |
| 7,492,849 B2* | 2/2009 | On | ....................... | H03D 13/004 |
| | | | | 327/158 |
| 7,627,003 B1* | 12/2009 | Fouts | ......................... | G06F 1/04 |
| | | | | 327/141 |
| 8,836,434 B2* | 9/2014 | Bellaouar | ............ | H03C 3/0991 |
| | | | | 327/156 |
| 2002/0089356 A1* | 7/2002 | Perrott | .................... | H03L 7/085 |
| | | | | 327/105 |
| 2004/0101079 A1* | 5/2004 | Braceras | ................... | H03L 7/00 |
| | | | | 375/373 |
| 2008/0157836 A1* | 7/2008 | Cho | ...................... | H03L 7/0814 |
| | | | | 327/158 |
| 2011/0169535 A1* | 7/2011 | Kyles | ........................ | H03L 7/07 |
| | | | | 327/156 |
| 2012/0105120 A1* | 5/2012 | Sornin | .................... | H03L 7/081 |
| | | | | 327/158 |
| 2013/0002317 A1* | 1/2013 | Frantzeskakis | ........... | H03L 7/18 |
| | | | | 327/156 |
| 2013/0027102 A1* | 1/2013 | Chen | ......................... | H03K 3/03 |
| | | | | 327/158 |
| 2014/0266346 A1* | 9/2014 | Park | ........................ | H03L 7/085 |
| | | | | 327/158 |
| 2014/0266355 A1* | 9/2014 | Park | ........................ | H03L 7/10 |
| | | | | 327/159 |
| 2014/0333352 A1* | 11/2014 | Lakkis | ...................... | H03L 7/06 |
| | | | | 327/156 |
| 2014/0347108 A1* | 11/2014 | Zerbe | .................... | H04L 7/0079 |
| | | | | 327/158 |
| 2015/0116016 A1* | 4/2015 | Salleh | .................... | H03L 7/0891 |
| | | | | 327/157 |
| 2015/0214959 A1* | 7/2015 | Feldman | ................... | G06F 1/04 |
| | | | | 327/156 |
| 2015/0341042 A1* | 11/2015 | Balachandran | ......... | H03L 7/099 |
| | | | | 327/156 |
| 2016/0036454 A1* | 2/2016 | Moehlmann | .......... | H03L 7/0994 |
| | | | | 327/147 |
| 2016/0056827 A1* | 2/2016 | Vlachogiannakis | ........................ | |
| | | | | H03B 5/1265 |
| | | | | 327/158 |

OTHER PUBLICATIONS

Jonathan Harris; "JESD204B Survival Guide"; technical article; 2013; Analog Devices, Inc.; One Technology Way, Norwood, MA; 02062; United States; 78 pages.

Silicon Laboratories Inc.; Si5332 Data Sheet; Rev. 1.2; Silicon Laboratories Inc.; 400 West Cesar Chavez; Austin, TX; 78701; United States; 72 pages.

Puneet Sareen; "JESD204B Multi-Device Synchronization Using LMK0461x"; application report; SNAU222; Aug. 2017; Texas Instruments; Post Office Box 655303; Dallas, Texas; 75265; United States; 26 pages.

Texas Instruments; "LMK04616 Ultra-Low Noise and Low Power JESD204B Compliant Clock Jitter Cleaner With Dual Loop PLLs"; data sheet; SNAS663; Mar. 2017; Texas Instruments; Post Office Box 655303; Dallas, Texas; 75265; United States; 128 pages.

Matt Guibord; "JESD204B multi-device synchronization: Breaking down the requirements"; analog application journal; 2015; Texas Instruments; Post Office Box 655303; Dallas, Texas; 75265; United States; 10 pages.

* cited by examiner

METASTABLE-FREE OUTPUT SYNCHRONIZATION FOR MULTIPLE-CHIP SYSTEMS AND THE LIKE

FIELD

The present disclosure relates generally to synchronous circuits, and more particularly to a chip that provides an output signal based on an external synchronization signal.

BACKGROUND

Modern digital electronic circuits use clock signals to time inputs and outputs. As modern integrated circuit manufacturing technology has advanced, circuits are able to operate at faster and faster speeds. For example, modern complementary metal-oxide-semiconductor (CMOS) technology allows logic circuits that can operate using clock speeds well above 1 gigahertz (GHz).

The higher-speed operation supported by modern integrated circuit technology has created certain problems. For example, when two or more integrated circuits provide output signals representing different slices of the same processed input signal, such as analog-to-digital (A/D) converters and the like, it is necessary that the output signals be synchronized to each other so that another circuit, such as a microprocessor or application-specific integrated circuit (ASIC), can process the multiple outputs as a unit. In order to solve these problems, the Joint Electron Devices Engineering Council (JEDEC) has promulgated a standard for synchronizing outputs across multiple integrated circuits for data converters in standard JESD204b/c. This standard specifies a system-level frame synchronization command, known as "~SYNC". Other systems use other similar techniques and signaling, such as a "SYNC" input signal, to synchronize outputs between different integrated circuits.

In these systems, each integrated circuit operates asynchronously to the system clock and to SYNC, and must internally capture the state of the SYNC signal to synchronize the output of a frame of data. In some circumstances, however, the SYNC signal can transition about the same time as an internally generated clock signal that is used to time the output signals. In this case, an internal circuit that samples the SYNC signal may become metastable.

For example, a capturing circuit such as a flip-flop may be unable to capture the external SYNC signal when it changes at about the same time as a transition in the internal clock signal. Not only is the data not "caught" or captured correctly at that edge, but additionally the capturing circuit suffers from a "confusion" of sorts. It captures a "confused" or intermediate mid-point value which is then output to the next stage requiring data. The time it takes for the capturing circuit to become "unconfused" can be statistically determined, but can be in some rare cases quite long. The bigger problem is not that the data is not captured perfectly at the exact earliest edge possible, but that the capturing device can be forced into this confused state. The confused state is known as metastability.

There are known circuits that detect metastability and keep their outputs in a certain state, such as a low state, until the metastability passes. However even these metastability-free circuits have an indeterminate time before the output signal transitions, which creates what is known as timing ambiguity. The delayed transition adds to output/output delay between the integrated circuits, which can prevent the system from meeting timing specifications.

Figure 1:
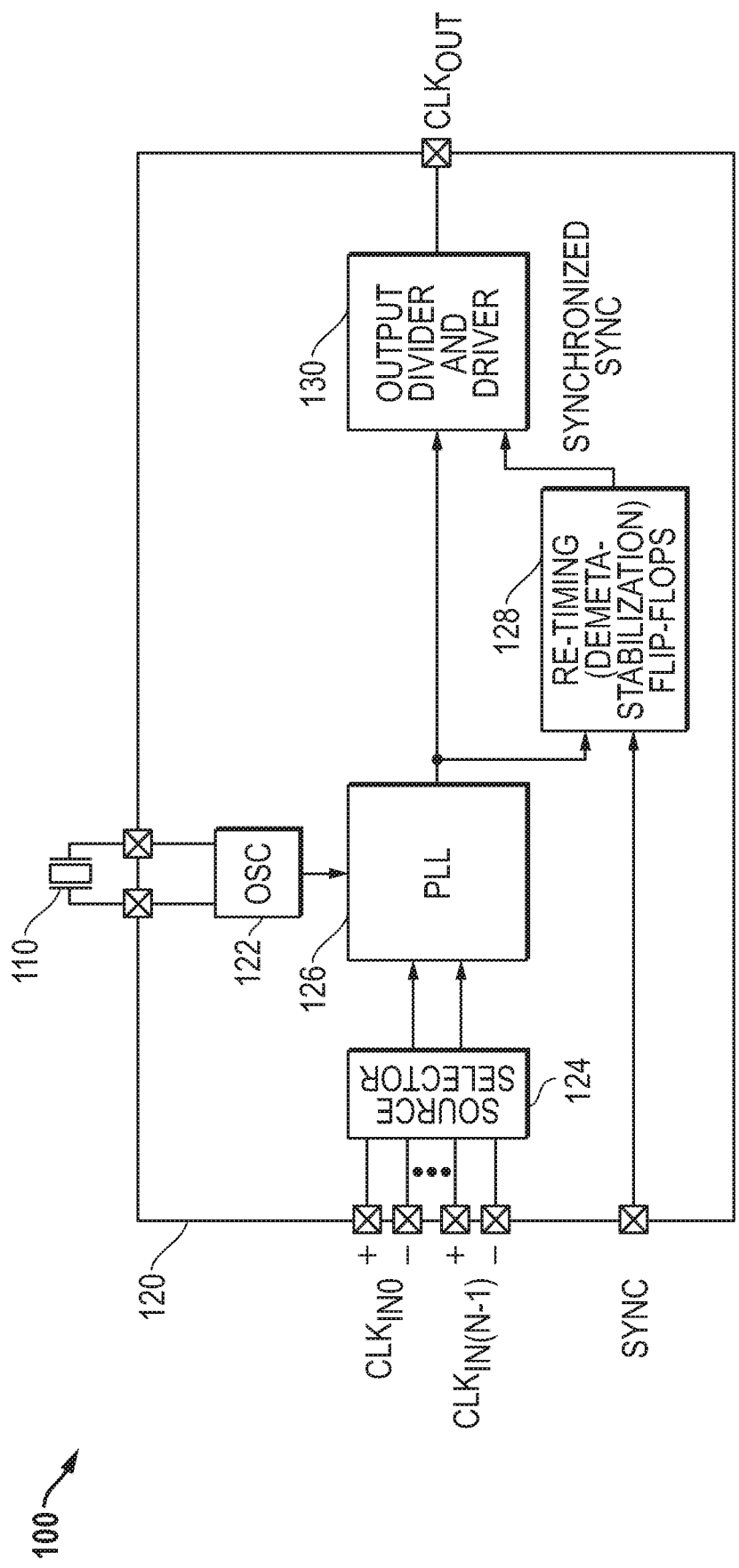
FIG. 1 illustrates in block diagram form a system for timing an output of a chip using an external synchronization signal known in the prior art.

In the following description, the use of the same reference numerals in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION OF ILLUSTRATIVE EMBODIMENTS

FIG. 1 illustrates in block diagram form a system 100 for timing an output of a chip 120 using an external synchronization signal known in the prior art. System 100 includes chip 120 and an external crystal 110 connected to chip 120. Chip 120 includes an oscillator 122, a source selector 124, a PLL 126 (phase locked loop), re-timing flip-flops 128, and an output divider and driver 130. Oscillator 122 is connected to external crystal 110 using two terminals of chip 120 and generates a stable oscillator clock signal at an output thereof according to a resonant frequency of external crystal 110. The resonant frequency is determined by the physical dimensions of external crystal 110 and can be very accurate. Source selector 124 has N differential input signal pairs capable of receiving clock signals from a variety of different sources through corresponding terminals, and a differential output. For example, FIG. 1 shows source selector 124 receiving exemplary input clock signal pairs $CLK_{IN0}+/CLK_{IN0}-$ and $CLK_{IN(N-1)}+/CLK_{IN(N-1)}-$. PLL 126 has a differential reference clock input connected to the output of source selector 124, an input connected to the output of oscillator 122, and an output. Retiming flip-flops 128 have a first input connected to the output of PLL 126, a second input for receiving an external synchronization signal labeled "SYNC", and an output for providing a signal labeled "SYNCHRONIZED SYNC". Output divider and driver 130 has a first input connected to the output of PLL 126, a second input connected to the output of re-timing flip-flops 128, and an output connected to a terminal of chip 120 for providing a signal labeled "CLK$_{OUT}$" thereto.

Chip 120 is a monolithic integrated circuit clock generator that provides a clock output signal CLK$_{OUT}$ at a programmable frequency and whose outputs are aligned with other similar outputs using the SYNC signal. In order to operate in a system having other similar chips, chip 120 is required to synchronize its output with the external SYNC signal. Thus, all chips operating together to provide outputs can provide them with a small and well-defined amount of skew with respect to each other, a characteristic known as output/output skew.

However, chip 120 presents a problem when operating with very high frequency clock signals. In order for the output/output skew to be small and well-defined, chip 120 includes re-timing flip-flops 128 to synchronize the external SYNC signal to the internal clock domain and to generate the SYNCHRONIZED SYNC signal in response. In asynchronous systems in which the phase of the SYNC signal compared to the phase of the output of PLL 126 is indeterminate, there is a finite chance that the phases will be so closely aligned that a flip-flop will not be able to assume a well-defined logic state within a period of the output of the PLL and become metastable.

To avoid propagating an indeterminate signal and potentially failing to capture a transition of the PLL signal, re-timing flip-flops 128 include multiple flip-flops that resolve the signal, but require an indeterminate number of clock cycles to resolve and protect against metastability For example, output divider and driver 130 captures the SYNCHRONIZEDED SYNC signal on the rising edge of the clock. The output of re-timing flip-flops 128 remains at their previous logic state, which may be either a '0' or a '1', until the new value is resolved.

However, the metastable condition may persist for as long as two or three clock cycles, thus preventing the CLK$_{OUT}$ signal from being provided for that amount of time. In this case, the output/output delay with respect to other chips may become unacceptably skewed. It would be desirable to provide a chip for use in a synchronized system with lower output/output skew caused by the use of re-timing flip-flops 128.

Figure 2:
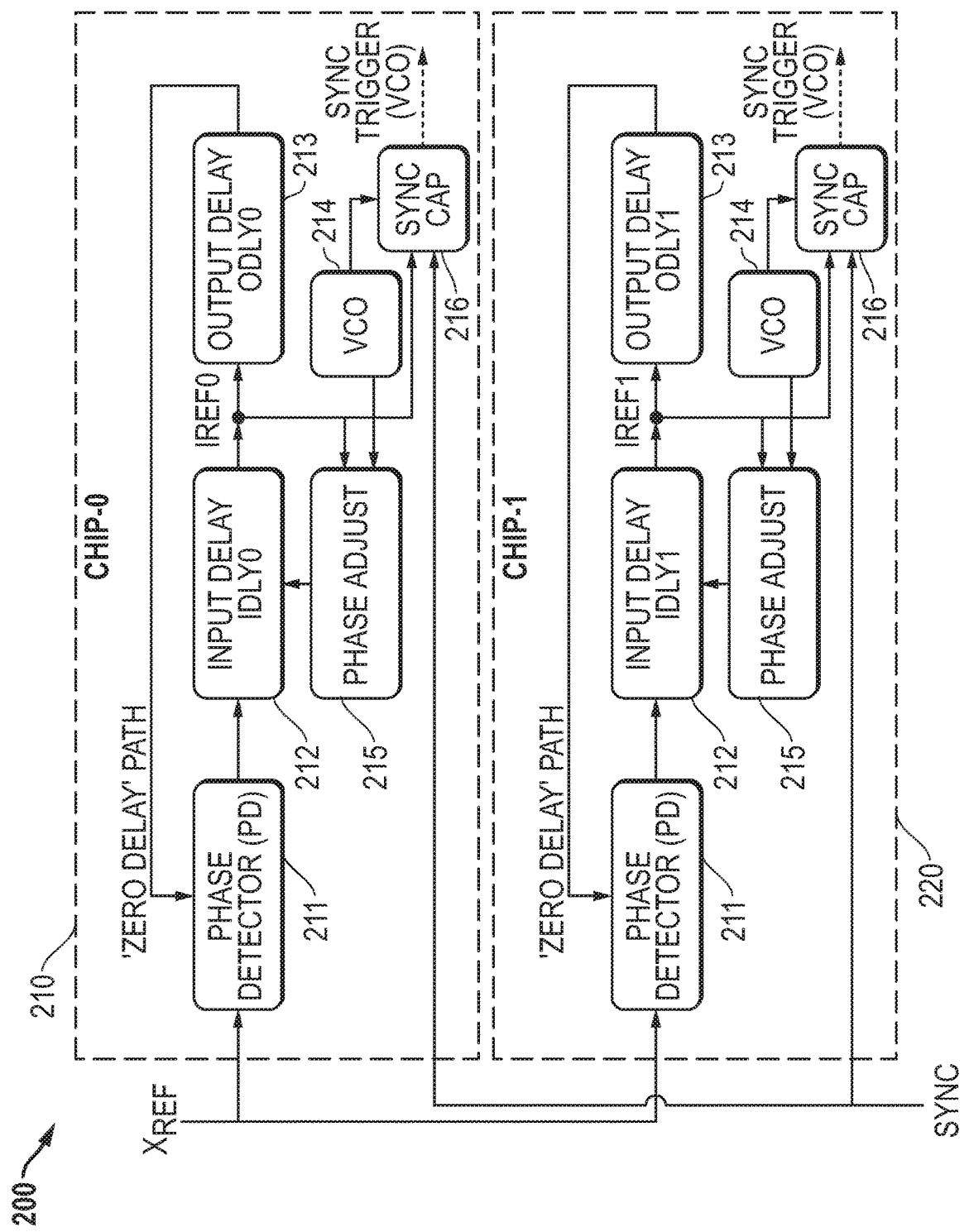
FIG. 2 illustrates in block diagram form a multi-chip synchronized system according to an embodiment of the present disclosure.

FIG. 2 illustrates in block diagram form a multi-chip synchronized system 200 according to an embodiment of the present disclosure. Multi-chip synchronized system 200 includes a chip 210 labeled "CHIP-0" and a chip 220 labeled "CHIP-1". Each of chip 210 and chip 220 is a high-speed CMOS integrated circuit having the same corresponding internal circuitry shown in FIG. 2 as indicated by the same reference numbers. Each of chips 210 and 220 has an input for receiving an external reference clock labeled "X$_{REF}$", an input for receiving synchronization signal SYNC, and an output for providing a signal labeled "SYNC TRIGGER (VCO)".

The common circuitry includes a phase detector 211, an input delay path 212, an output delay path 213, a voltage-controlled oscillator (VCO) 214, a phase adjustment circuit 215 labeled "PHASE ADJUST", and a synchronization capture circuit 216 labeled "SYNC CAP". Phase detector 211 has a first input for receiving the X$_{REF}$ clock signal, a feedback input, and an output. Input delay path 212 has an input connected to the output of phase detector 211, a control input, and an output for providing an internal reference clock signal. In the case of chip 210, the input delay is labeled "IDLY0" and the internal reference clock signal is labeled "I$_{REF0}$", and in the case of chip 220, the input delay is labeled "IDLY1" and the internal reference clock signal is labeled "I$_{REF1}$". Output delay path 213 has an input connected to the output of input delay path 212, and an output connected to the feedback input of phase detector 211. In the case of chip 210, the output delay is labeled "ODLY0" and in the case of chip 220, the output delay is labeled "ODLY1". VCO 214 has outputs for providing a local clock signal. Phase adjustment circuit 215 has a first input connected to the output of input delay path 212, a second input connected to the first output of VCO 214 for receiving the local clock signal, and an output connected to the control input of input delay path 212 for providing a phase adjustment signal thereto. Synchronization capture circuit 216 has a first input connected to the output of input delay path 212, a second input for receiving the local clock signal, a third input for receiving the SYNC signal, and an output for providing a synchronization trigger signal labeled "SYNC TRIGGER (VCO)".

In operation, input delay path 212 and output delay path 213 together form a zero-delay buffer (ZDB) configuration that phase detector 211 uses to phase and frequency lock the internal reference clock (I$_{REF0}$ or I$_{REF1}$ as the case may be) to external reference clock signal X$_{REF}$. This phase control loop compensates for delay path variations in input delay path 212 that are caused by manufacturing process, voltage, and temperature (PVT) variations. Both input delay path 212 and output delay path 213 provide a delay that varies over PVT limits or "corners".

Combined, phase detector 211, input delay path 212, output delay path 213, and phase adjustment circuit 215 form an output interpolative divider (OID) circuit. In one embodiment, input delay path 212 provides a variable delay in discrete steps of 1/256 of the period of the VCO clock signal, but in other embodiments the delay could be formed by analog circuits. The OID circuit inside each chip ensures that the chip captures the SYNC signal on the local clock domain that is used to generate the CLK$_{OUT}$ signal, and to do so within one local clock period of ambiguity across multiple chips.

Phase adjustment circuit 215 dynamically adjusts the phase of I$_{REF}$ until it is phase locked with a certain edge of the local clock signal generated by VCO 214. The phase-adjusted I$_{REF}$ signal is then used with the local clock signal to capture the SYNC signal to form the SYNC TRIGGER signal. The OID circuits dynamically align I$_{REF}$ to a selected, non-critical edge of the VCO clock signal, thus ensuring adequate setup and hold times for the SYNC signal to the other edge of the VCO clock signal so that sync capture circuit 216 can capture it without the risk of metastability. Moreover, each synchronization capture circuit 216 captures the SYNC signal on the VCO clock domain; since the VCO clock signal is typically significantly faster than external reference clock X$_{REF}$, it reduces the multi-chip output alignment timing ambiguity to one VCO period for the output/output delay. For example, assume that the VCO clock signals have a frequency of 12.5 GHz. The OID circuit of FIG. 2 reduces the output/output delay between chips 210 and 220 to 80 ps. For example, this ambiguity can be four times better than what could be achieved by using a conventional de-metastabilization flip-flop.

In other embodiments, VCO 214 can be replaced by another type of controlled oscillator such as a digitally controller oscillator (DCO), digitally-controlled crystal oscillator (DXCO), pulled crystal oscillator, controlled ring oscillator, and the like.

Figure 3:
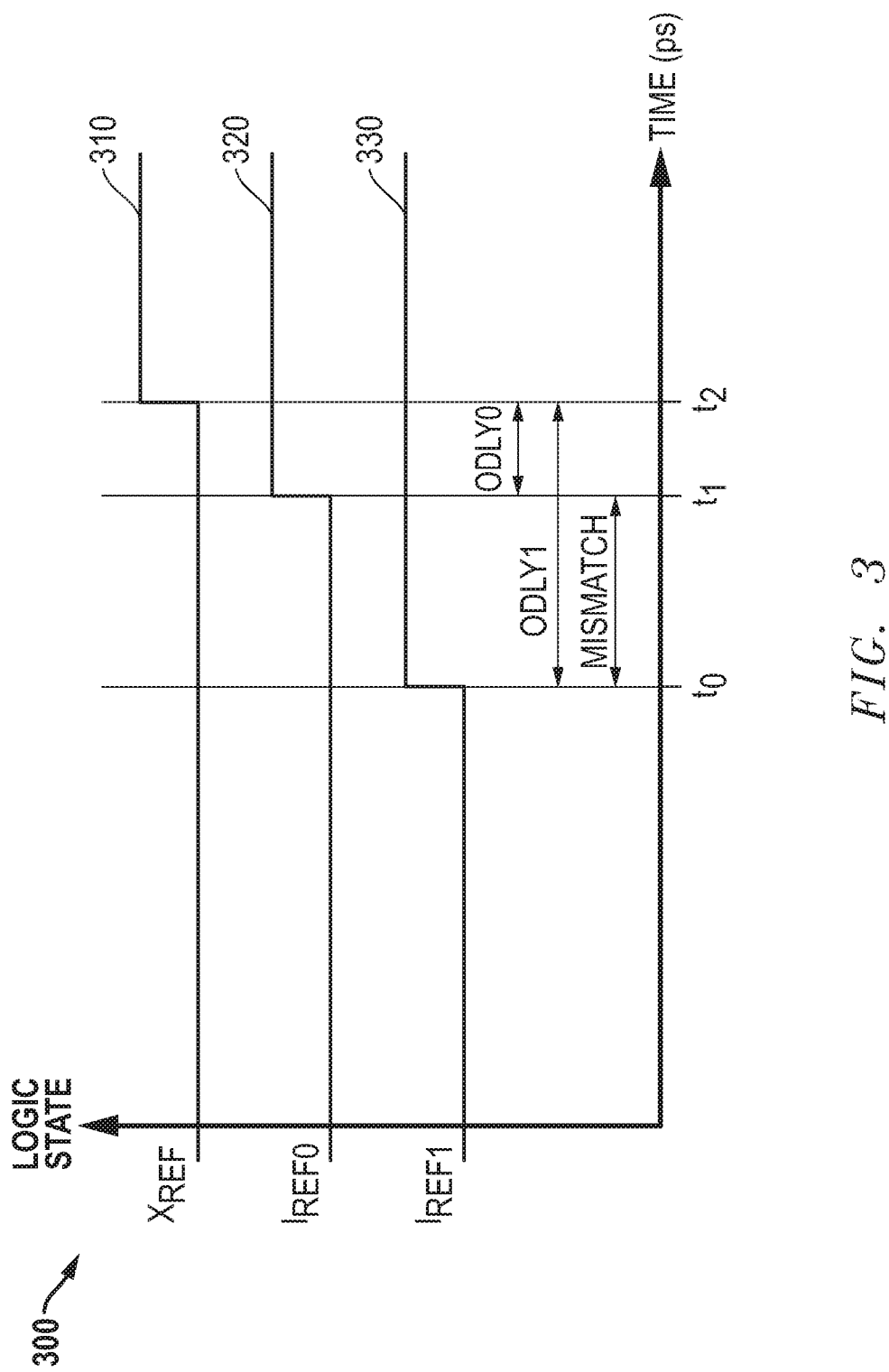
FIG. 3 illustrates a timing diagram of signals relevant to understanding the operation of the multi-chip synchronized system of FIG. 2.

FIG. 3 illustrates a timing diagram 300 of signals relevant to understanding the operation of multi-chip synchronized system 200 of FIG. 2. In timing diagram 300, the horizontal axis represents time in picoseconds (ps), and the vertical axis represents the logic states of various signals. Timing diagram 300 shows waveforms of three signals of interest, including a waveform 310 of external reference clock $X_{REF}$, a waveform 320 of the internal reference clock for chip 210 $I_{REF0}$, and a waveform 330 of the internal reference clock for chip 220 $I_{REF1}$. It also shows three time points of interest, labeled "$t_0$", "$t_1$", and "$t_2$". Timing diagram 300 illustrates how the timing of internal references can vary even when given the same external reference. In a typical system, chip 210 and chip 220 are integrated circuits coming from different manufacturing lots, or different silicon wafers in the same manufacturing lot, and in general have different process characteristics. Thus, for the case of the rising edge of external reference clock signal $X_{REF}$ at time $t_2$, chip 210 generates internal reference clock $I_{REF0}$ having a rising edge at time $t_1$ and an output delay ODLY0 to the rising edge of $X_{REF}$, and chip 220 generates internal reference clock $I_{REF1}$ having a rising edge at time to and an output delay ODLY1 to the rising edge of $X_{REF}$. The result is that there is a mismatch between the internal $I_{REF}$ signals of chips 210 and 220 labeled "MISMATCH" in timing diagram 300 representing the time between $t_0$ and $t_1$. However, the "zero delay" (ZD) configuration described with reference to FIG. 2 above eliminates the input path delay from the mismatch equation, ensuring that the OID outputs of the chips are aligned, even with significant differences in the timing of the internal $I_{REF}$ signals.

When the system has multiple chips each with OID circuits as described in FIG. 2, their internal clock signals $I_{REF}$ are aligned, less any differences in the output delay through output delay path 213, i.e. the MISMATCH. The OID circuits of FIG. 2 significantly reduce the output/output timing ambiguity of chip 120 of FIG. 1 relative to other chips using the ZD configuration. It also eliminates the need for re-timing (i.e. de-metastabilization) flip-flops 128 and allows SYNC capture circuit 216 to be formed with simple flip-flops. While FIG. 3 shows a MISMATCH that occurs between in the rising edges of $I_{REF0}$ and $I_{REF1}$ and $X_{REF}$, a corresponding MISMATCH will occur between the falling edges of $I_{REF0}$ and $I_{REF1}$ and $X_{REF}$, so this relationship applies regardless of whether the low-to-high or high-to-low transition is used on the ZD buffer loop. Further details of this operation will now be described.

Figure 4:
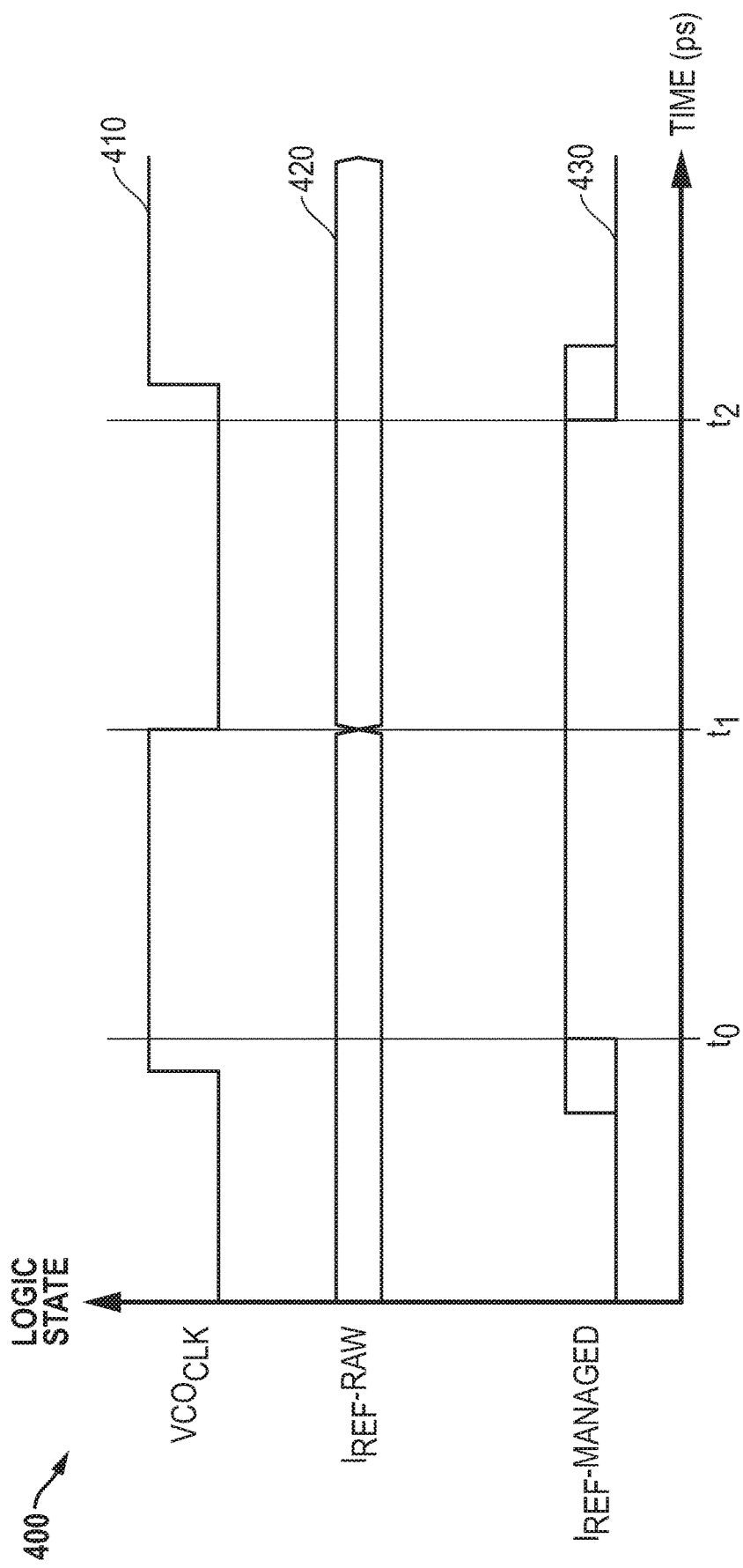
FIG. 4 illustrates another timing diagram of signals relevant to understanding the operation of the multi-chip synchronized system of FIG. 2.

FIG. 4 illustrates another timing diagram 400 of signals relevant to understanding the operation of multi-chip synchronized system 200 of FIG. 2. In timing diagram 400, the horizontal axis represents time in picoseconds (ps), and the vertical axis represents the logic states of various signals. Timing diagram 400 shows waveforms of three signals of interest, including a waveform 410 of the local clock signal labeled "$VCO_{CLK}$", a waveform 420 of internal reference clock $I_{REF}$ before the operation of the loop, labeled "$I_{REF}$-RAW", and a waveform 430 of internal reference clock $I_{REF}$ caused by the operation of the loop labeled "$I_{REF}$-MANAGED". Timing diagram 400 also shows three time points of interest, again labeled "$t_1$", "$t_1$", and "$t_2$".

Timing diagram 400 illustrates how an unmanaged internal reference clock, $I_{REF}$-RAW, having an unknown phase relationship to the $VCO_{CLK}$ signal can be effectively managed. Around $t_1$, $VCO_{CLK}$ makes a high-to-low transition. Due to process, voltage, and temperature (PVT) variations, there is no natural alignment of $I_{REF}$-RAW and $VCO_{CLK}$. Under worst-case conditions, $I_{REF}$-RAW transitions at about the same time as the falling edge of $VCO_{CLK}$ as shown in timing diagram 400. In known synchronization circuits like those of FIG. 1, this close alignment will give rise to metastability that, depending on the degree of alignment, will cause the output of a re-timing flip-flop such as re-timing flip-flops 128 of FIG. 1 to remain in a predetermined logic state for up to several clock cycles of $VCO_{CLK}$. However according to the embodiments disclosed herein, the OID circuit manages the transitions of $I_{REF}$ to move them away from the falling edges of $VCO_{CLK}$, and therefore ensure proper setup and hold times for latching the SYNC signal to generate the SYNC TRIGGER signal without the risk of metastability.

The OID circuit described in FIG. 2 above automatically moves the $I_{REF}$ transitions away from the falling edge of $VCO_{CLK}$, and toward the non-critical rising edges, ensuring that setup and hold times are met for SYNC capture circuit 250. Thus, the transition in $I_{REF}$-RAW that occurs around $t_1$ is moved to a point surrounding the rising edge of $VCO_{CLK}$ in $I_{REF}$-MANAGED. In this system, the setup time is $t_1-t_0$, and the hold time is $t_2-t_1$.

Note that timing diagram 400 shows the $I_{REF}$ period to be twice the $VCO_{CLK}$ period, but the $I_{REF}$ would more typically be several $VCO_{CLK}$ periods. As shown in timing diagram 400, the falling edge of $VCO_{CLK}$ is used to latch the SYNC signal in SYNC capture circuit 216, and chips 210 and 220 move the transitions of the SYNC signal to near the rising edge of $VCO_{CLK}$ to ensure adequate setup and hold times around the falling edge of $VCO_{CLK}$. In an alternate embodiment, the rising edge of $VCO_{CLK}$ can be used to latch the SYNC signal in SYNC capture circuit 250 and chips 210 and 220 would move the transitions of the SYNC signal to near the falling edge of $VCO_{CLK}$ to ensure adequate setup and hold times around the rising edge of $VCO_{CLK}$.

Figure 5:
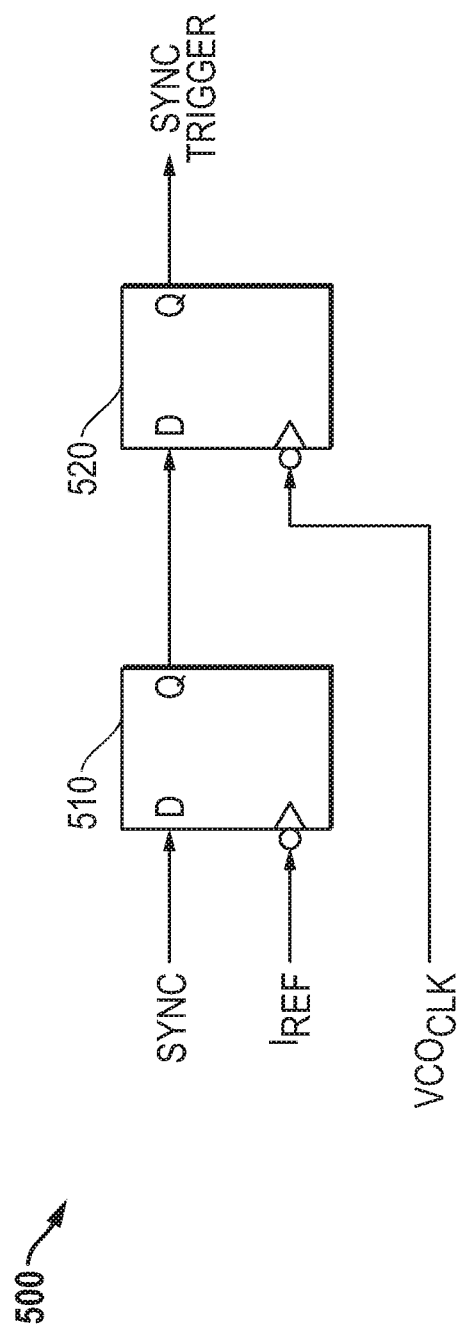
FIG. 5 illustrates in block diagram form a synchronization capture circuit that can be used as the synchronization capture circuit of FIG. 2.

FIG. 5 illustrates in block diagram form a synchronization capture circuit 500 that can be used as synchronization capture circuit 216 of FIG. 2. Synchronization capture circuit 500 includes a flip-flop 510 and a flip-flop 520. Flip-flop 510 is a clocked D flip-flop having a D input for receiving the SYNC signal, an active-low clock input for receiving $I_{REF}$, and a Q output. Flip-flop 520 is a clocked D flip-flop having a D input connected to the Q output of flip-flop 510, an active-low clock input for receiving $VCO_{CLK}$, and a Q output for providing the SYNC TRIGGER signal.

In operation, flip-flop 510 captures the SYNC signal on the falling edge of $I_{REF}$. The Q output of flip-flop 510 is a sub-sampled version of the SYNC signal that is effectively on the $VCO_{CLK}$ domain due to the $I_{REF}$ alignment by the phase adjust block. Flip-flop 520 captures the Q output of flip-flop 510 on the falling edge of the $VCO_{CLK}$ and thus is actually on the $VCO_{CLK}$ domain. Thus, the SYNC TRIGGER signal can be safely used for the inter-chip synchronization process without metastability.

Figure 6:
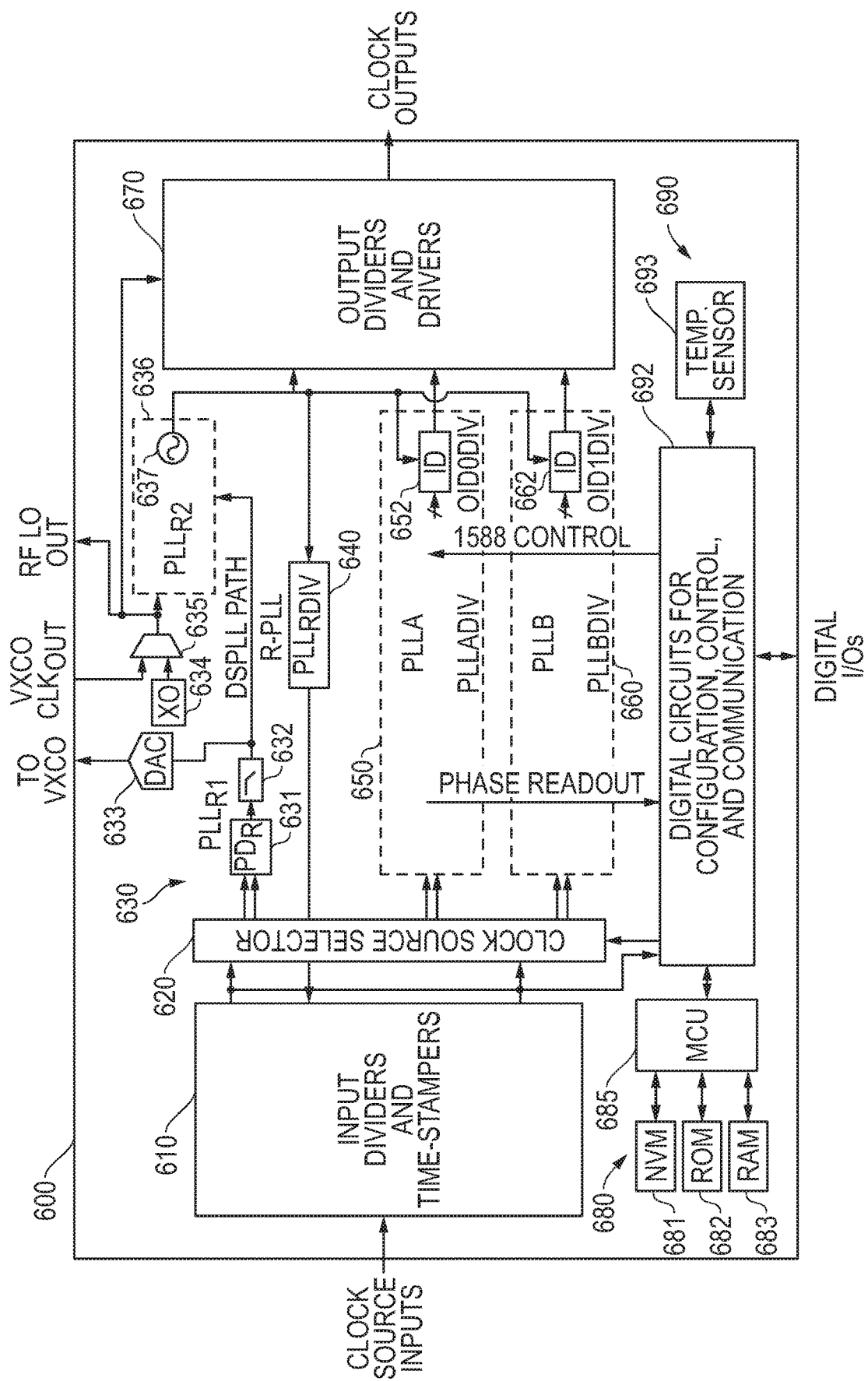
FIG. 6 illustrates in block diagram form a clock generator chip using output interpolative dividers according to an embodiment of the present disclosure.

FIG. 6 illustrates in block diagram form a clock generator chip 600 using output interpolative dividers according to an embodiment of the present disclosure. Clock generator chip 600 includes generally a set of input dividers and time-stampers 610, a clock source selector 620, an R-PLL 630, an R divider 640, a PLL 650 labeled "PLLA", a PLL 660 labeled "PLLB", a set of output dividers and drivers 670, a controller 680, and an interface circuit 690.

Input dividers and time-stampers 610 have inputs for receiving input clock signals from a variety of sources, and a set of corresponding outputs. It includes time-stampers that provide a stream of corresponding time codes that are processed by the various blocks downstream. Each clock signal source is divided in a programmable pre-divider or "P divider" that, in one embodiment, can form fractional dividers that divide the input clock according to a fraction having a programmable numerator and a programmable denominator.

Clock source selector 620 has inputs connected to the outputs of input dividers and time-stampers 610, a reference input, a control input, and a set of corresponding outputs. Clock source selector 620 is a multiplexer/crosspoint switch that allows any of the available time stamped values to be programmably switched to either of two inputs of any of the on-chip PLLs, one of which receives the reference clock and the other of which receives a feedback clock. Thus clock source selector 620 is a virtual switch.

R-PLL 630 includes a phase detector 631, a digital lowpass filter 632, a digital-to-analog converter 633, a crystal oscillator 634, a multiplexer 635, and a PLL 636 labeled "PLL$_{R2}$" having a digitally-controlled oscillator (DCO) 637. Phase detector 631 has an input connected to clock source selector 620 for receiving a series of time codes, and an output. Digital lowpass filter 632 has an input connected to the output of phase detector 631, and an output. DAC 633 has an input connected to the output of digital lowpass filter 632, and an output for providing a signal to an external voltage-controlled crystal oscillator (VXCO), not shown in FIG. 6. Crystal oscillator 634 has an input connected to an external crystal (not shown in FIG. 6), and an output. Multiplexer 635 has a first input for receiving an external output signal of the VXCO, a second input connected to the output of crystal oscillator 634, and an output for providing a radio frequency local oscillator clock labeled "RF LO OUT". PLL$_{R2}$ 636 is part of an inner loop and has an input connected to the output of multiplexer 635, a second input connected to the output of digital lowpass filter 632, and an output. DCO 637 is a part of PLL$_{R2}$ 636 and has an output for providing the VCO$_{CLK}$ signal.

R-divider 640 has an input connected to the output of VCO 637, and an output provided to an input of input dividers and time-stampers 610.

PLL 650 has an input connected to a corresponding output of clock source selector 620, a second input connected to the output of DCO 637, an input for connected to a bus labeled "1588 CONTROL", and an output connected to a bus labeled "PHASE READOUT", and a clock output. PLL 650 includes conventional elements associated with a programmable phase locked loop and in addition includes an output interpolative divider 652 labeled "ID". Output interpolative divider 652 has inputs connected to outputs of input dividers and time-stampers 610 for receiving a signal corresponding to the X$_{REF}$ signal, an input for receiving the SYNC signal, a clock input connected to the output of DCO 637, and an output for providing the I$_{REF0}$ signal to a sync capture circuit associated with PLL 650, not shown in FIG. 6.

PLL 660 has an input connected to a corresponding output of clock source selector 620, a second input connected to the output of DCO 637, an input for connected to a bus labeled "1588 CONTROL", and an output connected to a bus labeled "PHASE READOUT", and a clock output. PLL 650 includes conventional elements associated with a programmable phase locked loop and in addition includes an output interpolative divider 652 labeled "ID". Output interpolative divider 652 has inputs connected to outputs of input dividers and time-stampers 610 for receiving a signal corresponding to the X$_{REF}$, an input for receiving the SYNC signal, a clock input connected to the output of DCO 637, and an output for providing the I$_{REF1}$ signal to a sync capture circuit associated with PLL 650, not shown in FIG. 6.

Output divider and drivers 670 include a set of post-PLL dividers that are used to form clocks having sub-multiples of the frequency of the clock at the output of each PLL. In one example, each of a set of clock output divider and driver circuits has two separate programmable dividers and a driver for driving the divided clock signal off chip.

Controller 680 includes a phase readout circuit 681, a microcontroller unit (MCU) 682, and a non-volatile memory (NVM) 683. MCU 682 is a conventional MCU that executes stored program instructions and that has several input/output circuits and internal memory that make it suitable for embedded control applications. MCU 682 is bidirectionally connected to phase readout circuit 681 for sending and receiving phase information related to the operation of clock generator chip 600, and to non-volatile memory 683 for fetching stored program instructions, which will be further described below. It also receives time-stamp information and controls the selection of the clock sources.

Interface circuit 690 includes a digital circuits block used for configuration, communication, and control 692, and a temperature sensor 693. Digital circuits block 692 is bidirectionally connected to MCU 682 and temperature sensor 693, and has an external bidirectional port for conducting digital inputs and outputs (I/Os).

In operation, clock generator chip 600 is an exemplary embodiment of a single-chip clock generator that provides programmable operation with a high degree of flexibility for use in various digital applications, such as processing, instrumentation, communications, and control. The features that provide the flexibility are implemented in various circuit blocks. Input dividers and time-stampers 610 support multiple input clock sources, various combinations of which may be used according to the desired application. Input dividers and time-stampers 610 support an input divider known as a "P-divider" for each clock source that is programmable according to information stored in corresponding internal registers. Moreover, clock source selector 620 programmably switches the clock sources to the reference clock inputs of various PLLs as directed by MCU 682 (or alternatively serial communication ports connected to digital circuits 692) according to a programmable control register. The programmable clock source selection allows the clock source used by a particular PLL to be changed during operation. R-PLL 630 allows either an internally generated oscillator signal based or an external crystal or an external VXCO to be used as the reference clock source. Each of PLLs 650 and 660 includes a conventional closed loop PLL having programmable loop dividers designated "PLLADIV" for PLL 650, and "PLLBDIV" for PLL 660. Each of PLLs 650 and 660 also includes a corresponding output interpolative divider that has a programmable divide ratio, for example OIDDIV0 and OIDDIV1 for PLLs 650 and 660, respectively, as shown in FIG. 6. In certain embodiments, the digital I/Os implement certain well-known protocols including a serial peripheral interface bus, an inter-IC bus, and an IEEE 1149 boundary scan test bus commonly known as "JTAG". It should be apparent that clock generator chip 600 is just one possible clock chip that can advantageously use output interpolative dividers to reduce timing ambiguity and output/output delay.

In the embodiment of FIG. 6, controller 680 performs the function of phase adjustment circuit 215 of FIG. 2. In particular, controller 680 includes an MCU 685 and memory in the form of NVM 681, ROM 682, and RAM 683. NVM 683 is connected to MCU and is for storing instructions which, when executed by MCU 682, cause MCU 682 to adjust input delay path 212 to reduce a difference between the rising edge of the local clock signal (VCO$_{CLK}$) and the falling edge of the internal reference clock signal (I$_{REF}$). In other embodiments, NVM 683 can be replaced by other forms of memory. Alternatively, these instructions can be stored in ROM 682 or loaded into RAM 683 from an external memory.

Figure 7:
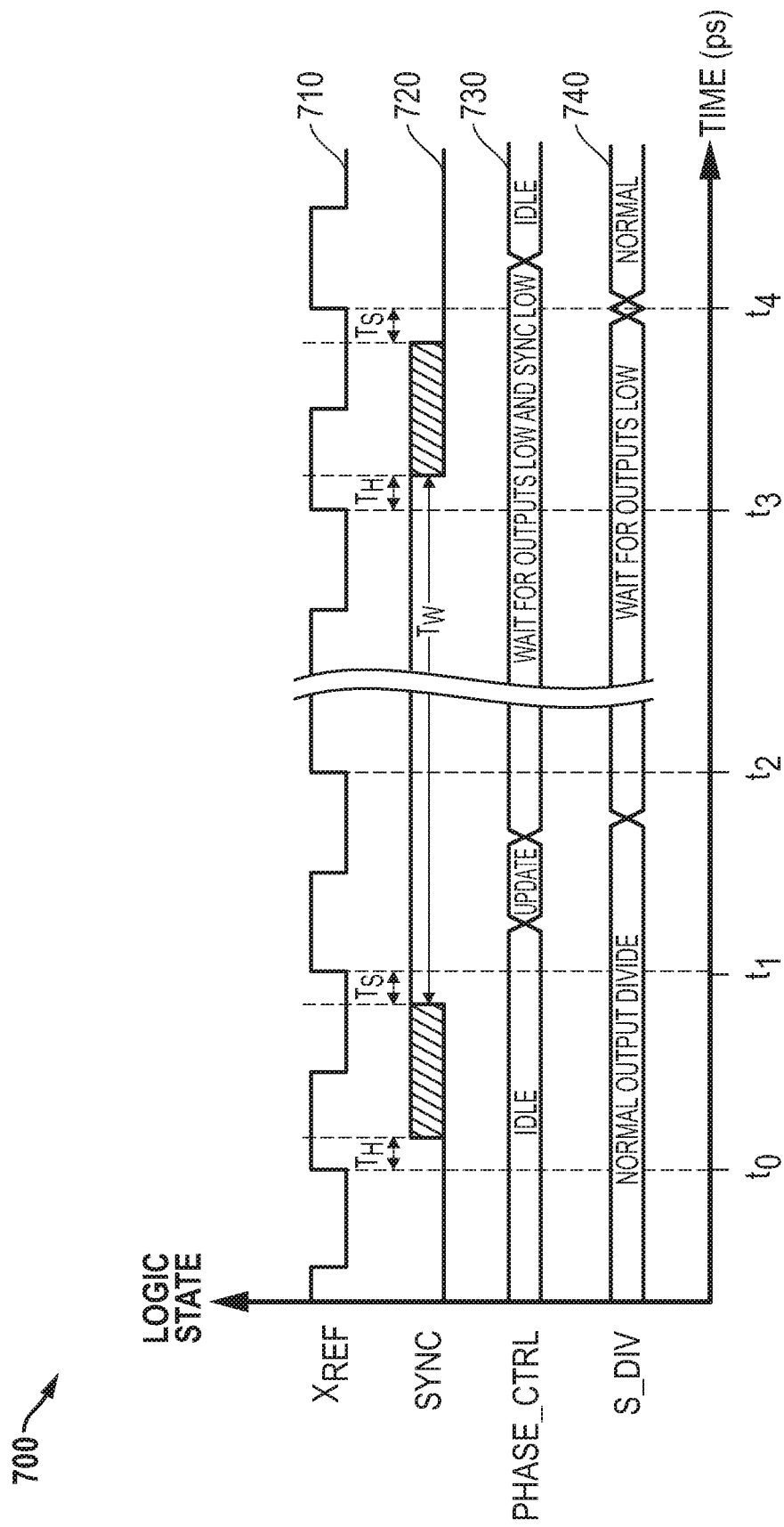
FIG. 7 illustrates a timing diagram of signals relevant to understanding the operation of the phase adjustable dividers and drivers of the clock generator chip of FIG. 6.

FIG. 7 illustrates a timing diagram 700 of signals relevant to understanding the operation of phase adjustable dividers in output dividers and drivers 670 of clock generator chip 600 of FIG. 6. In timing diagram 700, the horizontal axis represents time in ps, and the vertical axis represents the logic state or states of various signals or signal groups. Timing diagram 700 shows waveforms of four signals of interest, including a waveform 710 of external reference clock signal $X_{REF}$, a waveform 720 of the SYNC signal, a waveform 730 of a signal labeled "PHASE_CTRL", and a waveform 740 of a signal labeled "S_DIV".

Timing diagram 700 illustrates the timing of the SYNC signal with respect to the external reference and its impact on the operation of the output phase alignment circuits/operations. The goal of the $I_{REF}$ control loop is to make the $I_{REF}$ clock domain edge aligned with the $VCO_{CLK}$ domain so that no retiming is required to transfer information from the $I_{REF}$ domain to the $VCO_{CLK}$ domain. Eliminating the need for retiming is what reduces the chip-to-chip timing ambiguity. The rising edge of the SYNC pulse is not critical, and in response to the rising edge of the SYNC pulse, PHASE_CTRL provides an update for delay values. To ensure the cleanest, most reliable operation, the rising edge of the SYNC signal would maintain the same setup time ("$T_S$") and hold time ("$T_H$") as the falling edge. The width of the SYNC pulse, labeled "$T_W$" in FIG. 7, must be long enough for all outputs to go low. However, the falling edge of the SYNC pulse must meet setup and hold timing requirements around the rising edge of $I_{REF}$. Because $I_{REF}$ is not visible externally to the chip, by specifying the same setup and hold timing relationships for $X_{REF}$ with respect to SYNC, they are met for $I_{REF}$ because $X_{REF}$ and $I_{REF}$ are phase and frequency locked to avoid creating metastability. The window of time that the SYNC falling edges can meet setup and hold time requirements is shown as a cross-hatched time in waveform 720. The properly recognized falling edge of SYNC causes the dividers in output dividers and drivers 670, designated generically as "S" dividers, to restart, with the updated programmed delays used starting at the next $I_{REF}$ falling edge. Poor $X_{REF}$ balancing will reduce the window in which the SYNC falling edge time is valid. Due to potential $VCO_{CLK}$ phase differences in a multi-chip system, there may be up to 1 $VCO_{CLK}$ of output alignment error after synchronization.

Figure 8:
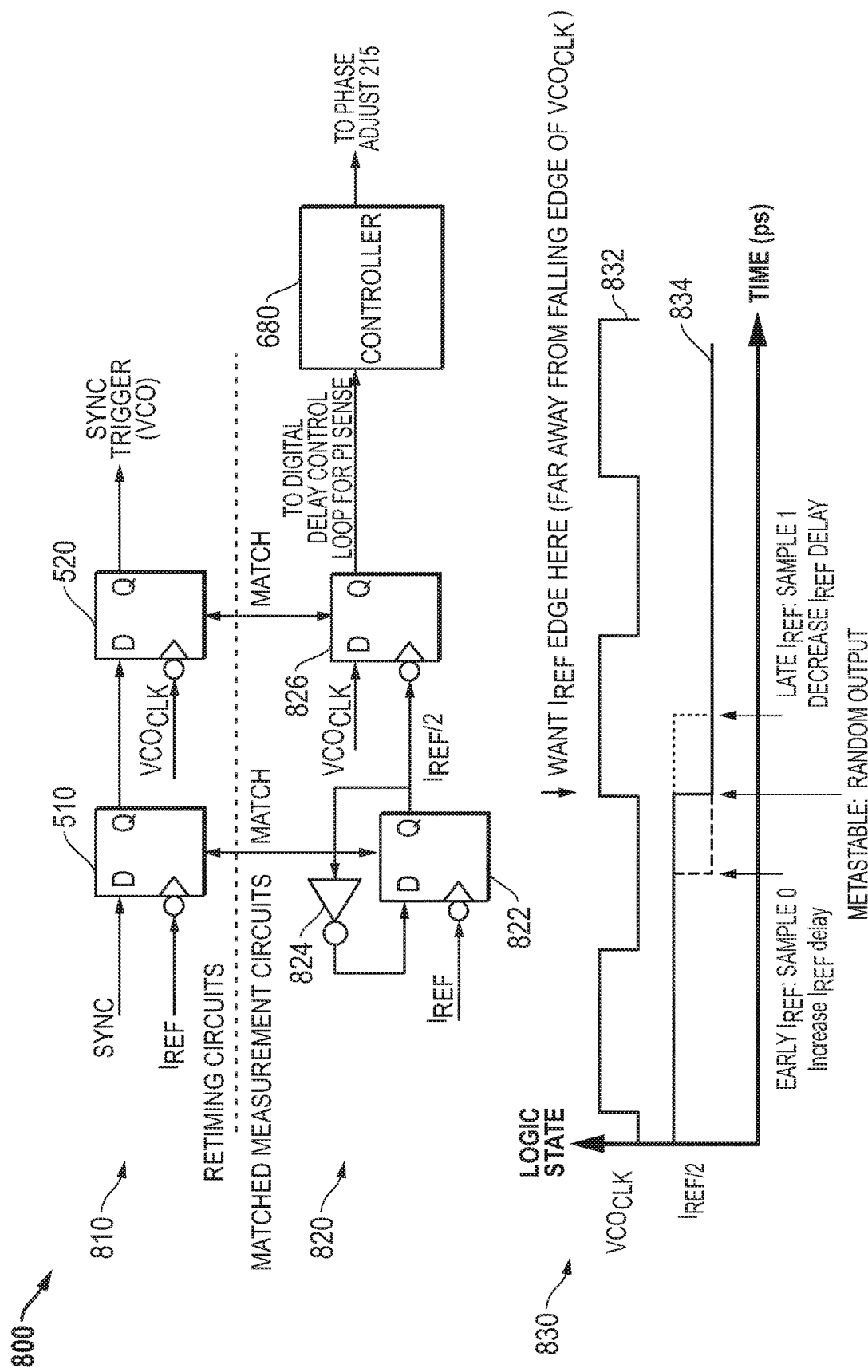
FIG. 8 illustrates a hybrid block and timing diagram useful in understanding the described embodiments.

FIG. 8 illustrates a hybrid block and timing diagram 800 useful in understanding the disclosed embodiments. The block diagram illustrates a simple exemplary circuit that can be used to detect and control the phase relationship between $I_{REF}$ and $VCO_{CLK}$, and the timing diagram corresponds to the operation of the circuit in the clock diagram. Hybrid block and timing diagram 800 illustrates in block diagram form a SYNC capture circuit 810 and a set of measurement circuits 820, and includes a timing diagram 830 illustrating the operation of a phase adjustment control loop useful in clock generator chip 600 of FIG. 6. Synchronization capture circuit 810 includes flip-flop 510 and flip-flop 520 as previously described with respect to FIG. 5 above. Matched measurement circuit 820 includes a flip-flop 822, an inverter 824, a flip-flop 826, and controller 680 as previously illustrated with respect to clock generator chip 600 of FIG. 6. Flip-flop 822 is a clocked D flip-flop having a D input, an active-low clock input for receiving $I_{REF}$, and a Q output. Inverter 824 has an input connected to the Q output of flip-flop 822, and an output connected to the D input of flip-flop 822. Flip-flop 826 is a clocked D flip-flop having a D input for receiving $VCO_{CLK}$, an active-low clock input for receiving $I_{REF}/2$, and a Q output. Controller 680 has an input connected to the Q output of flip-flop 826, and an output connected to phase adjustment circuit 215.

In timing diagram 830, the horizontal axis represents time in ps, and the vertical axis represents the logic states of particular signals of interest Timing diagram 830 shows waveforms of two signals of interest, including a waveform 832 of VCO clock signal $VCO_{CLK}$, and a waveform 834 of the divided $I_{REF}$ clock signal $I_{REF}/2$.

In operation, flip-flops 822 and 826 are matched to corresponding flip-flops 510 and 520, by having circuit designs, devices sizes, and physical layouts that match those of flip-flops 510 and 520, respectively. The output of flip-flop 826 indicates whether the falling edge of $I_{REF}$ leads or lags the rising edge of $VCO_{CLK}$. If these edges of $I_{REF}$ and $VCO_{CLK}$ are aligned, then the output of flip-flop 826 will produce a stream of random 0s and 1s at the $I_{REF}/2$ rate. Controller 680 receives the pulse stream of 0s and is and adjusts the control loop until the number of 0s balances out the number of 1s. It uses a proportional-integral ("PI") control loop for loop stability. In an exemplary embodiment, controller 680 performs the PI control by executing firmware stored in NVM 683. In other embodiments, this control loop can be performed completely in hardware or in various combinations of hardware and software.

Thus, a chip having output synchronization has been disclosed. It can be used to implement a system with low output/output delay mismatch by limiting the timing ambiguity indicated by a SYNC or similar signal, to a local clock. The local clock is typically much higher frequency than the external clock signal received with the SYNC pulse. In one form, the chip includes a phase detector for receiving an external reference clock signal, an input delay path coupled to an output of the phase detector and having an output for providing an internal reference clock signal, an output delay path coupled to the output of the input delay path and having an output coupled to a feedback input of the phase detector, a phase adjustment circuit having a first input coupled to the output of the input delay path, a second input for receiving a local clock signal, and an output coupled to the control input of the input delay path, and a synchronization capture circuit having a first input coupled to the output of said input delay path, a second input for receiving the local clock signal, a third input for receiving a synchronization signal, and an output for providing a synchronization trigger signal.

The above-disclosed subject matter is to be considered illustrative, and not restrictive, and the appended claims are intended to cover all such modifications, enhancements, and other embodiments that fall within the true scope of the claims. For example, various chips can be constructed using the circuits and techniques herein for applications such as processing, instrumentation, communications, and control. The function performed by the chips can vary as well, such as clock generation, data conversion, data measurement, and the like. The chip can have a single OID circuit, or multiple-OID circuits. Moreover, the particular clock transitions used for different signals in the ZD buffer loops in the OID circuits can vary between embodiments.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A chip having output synchronization, comprising:
a phase detector having an input for receiving an external reference clock signal, a feedback input, and an output;
an input delay path having a first input coupled to said output of said phase detector, a control input, and an output for providing an internal reference clock signal;
an output delay path having an input coupled to said output of said input delay path, and an output coupled to said feedback input of said phase detector;
a phase adjustment circuit having a first input coupled to said output of said input delay path, a second input for receiving a local clock signal, and an output coupled to said control input of said input delay path for providing a phase adjustment signal; and
a synchronization capture circuit having a first input coupled to said output of said input delay path, a second input for receiving said local clock signal, a third input for receiving a synchronization signal, and an output for providing a synchronization trigger signal.

2. The chip of claim 1, wherein said synchronization capture circuit comprises:
a first flip-flop having an input for receiving said synchronization signal, a clock input for receiving said internal reference clock signal, and an output; and
a second flip-flop having an input coupled to said output of said first flip-flop, a clock input for receiving said local clock signal, and an output for providing said synchronization trigger signal.

3. The chip of claim 2, wherein each of said first flip-flop and said second flip-flop comprises a clocked D-type flip-flop.

4. The chip of claim 1, further comprising:
a controlled oscillator having an output for providing said local clock signal.

5. The chip of claim 1, wherein:
said output delay path has a delay that is fixed.

6. The chip of claim 5, wherein:
said delay of said output delay path varies only with respect to variations in process, voltage, and temperature (PVT).

7. The chip of claim 1, wherein:
said phase adjustment circuit provides said phase adjustment signal to said control input of said input delay path as an analog signal.

8. The chip of claim 1, wherein:
said phase adjustment circuit provides said phase adjustment signal to said control input of said input delay path as a digital control signal, and said input delay path adjusts a delay thereof in discrete steps according to said digital control signal.

9. The chip of claim 1, further comprising:
a measurement circuit for sensing a difference between a first predetermined edge of said local clock signal and a second predetermined edge of said internal reference clock signal; and
a controller for adjusting said input delay path to reduce said difference between said first predetermined edge of said local clock signal and said second predetermined edge of said internal reference clock signal.

10. The chip of claim 9, wherein said first predetermined edge of said local clock signal comprises a rising edge and said second predetermined edge of said internal reference clock signal comprises a falling edge.

11. The chip of claim 9, wherein said controller comprises:
a micro-controller unit (MCU) coupled to said measurement circuit; and
a memory coupled to said MCU for storing instructions which, when executed by said MCU, causes said MCU to adjust said input delay path to reduce said difference between said first predetermined edge of said local clock signal and said second predetermined edge of said internal reference clock signal.

12. The chip of claim 11, wherein said instructions further cause said MCU to implement proportional-integral (PI) control.

13. The chip of claim 1, further comprising:
an output circuit for providing at least one output in response to said sync trigger signal.

14. A multi-chip synchronized system comprising:
a first chip having a first input for receiving an external reference clock signal, a second input for receiving a synchronization signal, and an output for providing a first output signal in response to said external reference clock signal and said synchronization signal;
a second chip having a first input for receiving said external reference clock signal, a second input for receiving said synchronization signal, and an output for providing a second output signal in response to in response to said external reference clock signal and said synchronization signal;
wherein each of said first chip and said second chip comprises:
a phase detector having an input for receiving said external reference clock signal, a feedback input, and an output;
an input delay path having a first input coupled to said output of said phase detector, a control input, and an output for providing an internal reference clock signal;
an output delay path having an input coupled to said output of said input delay path, and an output coupled to said feedback input of said phase detector;
a phase adjustment circuit having a first input coupled to said output of said input delay path, a second input for receiving a local clock signal, and an output coupled to said control input of said input delay path for providing a phase adjustment signal; and
a synchronization capture circuit having a first input coupled to said output of said input delay path, a second input for receiving said local clock signal, a third input for receiving said synchronization signal, and an output for providing a synchronization trigger signal.

15. The multi-chip synchronized system of claim 14, wherein said synchronization capture circuit comprises:
a first flip-flop having an input for receiving said synchronization signal, a clock input for receiving said internal reference clock signal, and an output; and
a second flip-flop having an input coupled to said output of said first flip-flop, a clock input for receiving said local clock signal, and an output for providing said synchronization trigger signal.

16. The multi-chip synchronized system of claim 15, wherein each of said first flip-flop and said second flip-flop comprises a clocked D-type flip-flop.

17. The multi-chip synchronized system of claim 14, further comprising:
a controlled oscillator having an output for providing said local clock signal.

18. The multi-chip synchronized system of claim 14, wherein:
said output delay path has a delay that is fixed.

19. The multi-chip synchronized system of claim 18, wherein:
said delay of said output delay path varies only with respect to variations in process, voltage, and temperature (PVT).

20. The multi-chip synchronized system of claim 14, wherein:
said phase adjustment circuit provides said phase adjustment signal to said control input of said input delay path as an analog signal.

21. The multi-chip synchronized system of claim 14, wherein:
said phase adjustment circuit provides said phase adjustment signal to said control input of said input delay path as a digital control signal, and said input delay path adjusts a delay thereof in discrete steps according to said digital control signal.

22. The multi-chip synchronized system of claim 14, wherein each of said first chip and said second chip further comprises:
an output circuit for providing at least one output in response to said sync trigger signal.

23. A method of reducing timing ambiguity in a synchronized system, comprising, in at least a first chip:
receiving an external clock reference signal;
receiving a synchronization signal;
generating a local clock signal having a higher frequency than the external reference clock signal;
generating an internal reference clock signal in response to the external clock reference signal and the local clock signal, said generating comprising varying a delay of an input delay path whose output provides said internal reference clock signal in response to a phase difference between a first predetermined edge of the local clock signal and a second predetermined edge of the internal reference clock signal;
forming a zero delay buffer locked loop using the input delay path and an output delay path; and
capturing an edge of the synchronization signal using the local clock signal and the internal reference clock signal and generating a synchronization trigger signal in response to the capturing.

24. The method of claim 23, further comprising:
providing at least one output in response to said sync trigger signal.

25. The method of claim 24, further comprising:
changing said varying said delay of said input delay path by reducing a difference between a third predetermined edge of said local clock signal and a fourth predetermined edge of said internal reference clock signal.

26. The method of claim 25, wherein said reducing comprises:
reducing said difference using proportional-integral (PI) control.

* * * * *